(12) United States Patent
Tang

(10) Patent No.: US 12,444,673 B2
(45) Date of Patent: Oct. 14, 2025

(54) ELECTRONIC PACKAGE AND METHOD FOR MANUFACTURING THE SAME

(71) Applicant: NEXPERIA B.V., Nijmegen (NL)

(72) Inventor: Qingyuan Tang, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 536 days.

(21) Appl. No.: 17/898,883

(22) Filed: Aug. 30, 2022

(65) Prior Publication Data

US 2023/0066554 A1    Mar. 2, 2023

(30) Foreign Application Priority Data

Aug. 30, 2021    (EP) .................................... 21193724

(51) Int. Cl.
| | | |
|---|---|---|
| *H01L 21/48* | (2006.01) | |
| *H01L 21/56* | (2006.01) | |
| *H01L 23/31* | (2006.01) | |
| *H01L 23/498* | (2006.01) | |
| H01L 23/00 | (2006.01) | |

(52) U.S. Cl.
CPC .... *H01L 23/49838* (2013.01); *H01L 21/4853* (2013.01); *H01L 21/486* (2013.01); *H01L 21/565* (2013.01); *H01L 23/3121* (2013.01); *H01L 23/49811* (2013.01); *H01L 23/49833* (2013.01); *H01L 23/49844* (2013.01); *H01L 24/32* (2013.01); *H01L 2224/32227* (2013.01); *H01L 2224/32238* (2013.01); *H01L 2924/1203* (2013.01); *H01L 2924/1304* (2013.01); *H01L 2924/182* (2013.01)

(58) Field of Classification Search
CPC ........... H01L 23/49838; H01L 21/4853; H01L 21/486
See application file for complete search history.

(56) References Cited

U.S. PATENT DOCUMENTS

| | | | | |
|---|---|---|---|---|
| 8,729,714 B1 * | 5/2014 | Meyer | ..................... | H01L 24/92 257/777 |
| 12,327,782 B2 * | 6/2025 | Lin | ................... | H01L 23/49838 |
| 12,327,784 B2 * | 6/2025 | Park | .................. | H01L 23/49833 |
| 12,327,796 B2 * | 6/2025 | Yu | ........................ | H01L 23/5381 |
| 12,327,824 B2 * | 6/2025 | Kim | ........................ | H01L 24/16 |
| 12,327,825 B2 * | 6/2025 | Chang | .................. | H01L 23/3128 |

(Continued)

FOREIGN PATENT DOCUMENTS

EP    1076414 A2    2/2001

OTHER PUBLICATIONS

Extended European Search Report for corresponding European application EP21193724.8, 7 pages dated Mar. 10, 2022.

*Primary Examiner* — Thao P Le
(74) *Attorney, Agent, or Firm* — Ruggiero McAllister McMahon LLC

(57) ABSTRACT

An electronic package having a miniaturized footprint and a method for manufacturing the same is provided. Due to the arrangement of bottom contacts of the electronic package using a first partial vias, a footprint is obtained that is miniaturized with respect to the known electronic package comprising a same-sized electronic component. The electronic package according to the present disclosure enables packaging multiple electronic components while nevertheless minimally increasing the footprint with respect to conventional electronic packages.

18 Claims, 7 Drawing Sheets

(56) References Cited

U.S. PATENT DOCUMENTS

| | | |
|---|---|---|
| 2004/0226741 A1 | 11/2004 | Masuko et al. |
| 2017/0372989 A1 | 12/2017 | Kim et al. |
| 2018/0240738 A1* | 8/2018 | Chen .................... H01L 21/561 |
| 2025/0183190 A1* | 6/2025 | Otsubo ................ H01L 25/112 |
| 2025/0183816 A1* | 6/2025 | Fukase .............. H02M 7/53873 |

* cited by examiner

ELECTRONIC PACKAGE AND METHOD FOR MANUFACTURING THE SAME

CROSS REFERENCE TO RELATED APPLICATION

This application claims the benefit under 35 U.S.C. § 119(a) of European Application No. 21193724.8 filed Aug. 30, 2021, the contents of which are incorporated by reference herein in their entirety.

BACKGROUND OF THE DISCLOSURE

1. Field of the Disclosure

The present disclosure relates to an electronic package and a method for manufacturing the same. More particularly, the present disclosure relates to a substrate-based electronic package, such as a PCB-based package.

2. Description of the Related Art

Electronic components can be arranged in an electronic package to protect said electronic component(s) from external damages, such as damages due to mechanical stress, contamination and/or light exposure. An electronic package typically comprises means (e.g., leads) for enabling external access to the electronic component(s) arranged therein. For example, the electronic package may be mounted on and electrically connected to solder pads arranged on a printed circuit board (PCB) through said means.

An example of an electronic package is a semiconductor package. Conventionally, for semiconductor packages, a semiconductor die having a circuit integrated thereon is arranged on a lead frame, and electrical connections between terminals of the circuit and leads of the lead frame are realized by wire bonding. Although such electronic packages are commonly used and cost-effective, wire bonding typically imposes a limit on the minimum size of the electronic package. Therefore, an electronic package without wire bonding is preferred in some applications.

FIG. 1 shows an electronic package 100 known in the art that does not require wire bonding. Electronic package 100 comprises a first PCB comprising a first dielectric layer 101a and a first inner contact 102a arranged on an inner surface of said first dielectric layer 101a, and a second PCB comprising a second dielectric layer 101b and a second inner contact 102b arranged on an inner surface of said second dielectric layer 101b. Electronic package 100 further comprises an electronic component 103 (e.g., a semiconductor die) arranged in between the first and second PCB. A first terminal of electronic component 103 is electrically connected to first inner contact 102a and a second terminal of electronic component 103 is electrically connected to second inner contact 102b. Electronic component 103 is encapsulated by the first and second PCB and an encapsulation material 104.

Electronic package 100 further comprises a first surrounding contact 105a electrically connected to first inner contact 102a, and a second surrounding contact 105b electrically connected to second inner contact 102b. A mounting surface 106 by which electronic package 100 can be mounted (e.g., on another PCB) extends along a portion of a surface of first and second surrounding contact 105a, 105b that is arranged on an outer surface of first dielectric layer 101a.

The known electronic package described above does not require wire bonding, such that a smaller footprint with respect to a lead frame based electronic package can be achieved. However, for certain applications, an even smaller footprint is preferred or may even be necessary.

SUMMARY

It is thus an object of the present disclosure to provide an electronic package having a miniaturized footprint.

According to an aspect of the present disclosure, an electronic package is provided. The electronic package comprises a first substrate comprising a first dielectric layer, a second substrate comprising a second dielectric layer, the second substrate being mutually fixated relative to the first substrate, a first electronic component arranged in between the first and second substrate, the first electronic component having a plurality of first terminals, and a plurality of first inner contacts, each first inner contact being arranged on the first dielectric layer or the second dielectric layer. Each first terminal among the plurality of first terminals is electrically connected to at least one first inner contact among the plurality of first inner contacts, and each first inner contact among the plurality of first inner contacts is electrically connected to at least one first terminal among the plurality of first terminals.

The electronic package according to the present disclosure is characterized in that it further comprises a plurality of first partial vias, each partial via having a side wall and being arranged in the first or second dielectric layer, wherein each first inner contact among the plurality of first inner contacts is electrically connected to at least one first partial via among the plurality of first partial vias, wherein the side wall of each first partial via among the plurality of first partial vias, and/or a metal contact layer arranged on said side wall, forms at least part of a first bottom contact of the electronic package and forms at least part of a mounting surface of the electronic package.

Due to the arrangement of the bottom contacts of the electronic package using the first partial vias, a footprint is obtained that is miniaturized with respect to the known electronic package comprising a same-sized electronic component.

The first substrate and the second substrate may extend in a direction perpendicular to the side wall of each of the plurality of first partial vias. In other words, the side wall of a partial via may correspond to a wall along a direction in which the first partial via extends through the first or second dielectric layer.

The electronic package may further comprise a plurality of first outer contacts arranged on an opposing surface of the first dielectric layer and/or the second dielectric layer with respect to the plurality of first inner contacts. Each first outer contact among the plurality of first outer contacts may be electrically connected to at least one first partial via among the plurality of first partial vias, and each first outer contact among the plurality of first outer contacts may form a first side contact of the electronic package.

The side contacts formed by the first outer contacts provide a side-solderable (or side-wettable) surface enabling a simplified automatic optical inspection of the solder joint after the electronic package is mounted, which may be particularly useful in, for example, automotive assembling processes.

The first substrate and the second substrate may extend parallel to each other. For example, the first dielectric layer of the first substrate may be parallel to the second dielectric layer of the second substrate.

An outer surface of the first substrate and an outer surface of the second substrate may each form at least part of a side surface of the electronic package. In some embodiments, the outer surface of the first substrate and the outer surface of the second substrate may each extend in a direction perpendicular to the mounting surface.

The electronic package may further comprise one or more second electronic components arranged in between the first and second substrate, each of the one or more second electronic components having a plurality of second terminals, a plurality of second inner contacts, each second inner contact being arranged on the first dielectric layer or the second dielectric layer, and a plurality of second partial vias, each second partial via having a side wall and being arranged in the first or second dielectric layer. Each second inner contact among the plurality of second inner contacts may be electrically connected to at least one second partial via among the plurality of second partial vias. Furthermore, the side wall of each second partial via among the plurality of second partial vias, and/or a metal contact layer arranged on said side wall, may form at least part of a second bottom contact of the electronic package and may form at least part of the mounting surface of the electronic package. Each second terminal may be electrically connected to at least one second inner contact among the one or more second inner contacts, and each second inner contact among the plurality of second inner contacts may be electrically connected to at least one second terminal.

The electronic package according to the present disclosure enables packaging multiple electronic components while nevertheless minimally increasing the footprint with respect to conventional electronic packages.

The electronic package may further comprise a plurality of second outer contacts arranged on an opposing surface of the first dielectric layer and/or the second dielectric layer with respect to the plurality of second inner contacts. Each second outer contact among the plurality of second outer contacts may be electrically connected to least one second partial via among the plurality of second partial vias, and each second outer contact among the plurality of second outer contacts may form a second side contact of the electronic package.

At least one of the plurality of first inner contacts may be electrically connected to at least one of the plurality of second inner contacts. Additionally or alternatively, at least one of the plurality of first outer contacts may be electrically connected to at least one of the plurality of second outer contacts.

In the above embodiment, various configurations and interconnections of electronic components within the electronic package can be formed without requiring electrical connections external to the package. For example, the electronic components could be arranged in parallel or in series with respect to one another in the electronic package, or a terminal of the first electronic component could be electrically connected to a terminal of the one or more second electronic components internally to the package.

At least one of the first electronic component and, if applicable, the one or more second electronic components may comprise a semiconductor die having a circuit integrated thereon. Each circuit may comprise a plurality of circuit terminals, each circuit terminal being electrically connected to a respective terminal of said first or second electronic component.

The electronic package may further comprise an encapsulation material arranged in between the first substrate and the second substrate. The encapsulation material, the first substrate and the second substrate may together encapsulate the first electronic component and/or, if applicable, the one or more second electronic components. The encapsulation material may comprise a molding compound or an underfill material having high capillary action at least during arranging said encapsulation material in between the first substrate and the second substrate The first substrate and/or the second substrate may comprise a printed circuit board, 'PCB', preferably one of an organic substrate, a ceramic substrate and a glass substrate.

According to another aspect of the present disclosure, a method for manufacturing an electronic package is provided. The method comprises: providing a first substrate comprising a first dielectric layer and a second substrate comprising a second dielectric layer, wherein each of a plurality of first inner contacts is arranged on the first dielectric layer or the second dielectric layer, wherein each of a plurality of first vias is arranged in the first dielectric layer or the second dielectric layer, and wherein each first inner contact among the plurality of first inner contacts is electrically connected to at least one first via among the plurality of first vias; arranging a first electronic component in between the first and second substrate, the electronic component comprising a plurality of first terminals, each first terminal among the plurality of first terminals being electrically connected to at least one first inner contact among the plurality of first inner contacts, and each first inner contact among the plurality of first inner contacts being electrically connected to at least one first terminal among the plurality of first terminals; mutually fixating the first and second substrates, thereby defining a package body comprising a package portion in which the plurality of first inner contacts and the first electronic component are arranged; and performing a separating action along a separating surface extending through the plurality of first vias, thereby separating the package portion from a remainder of the package body and forming a plurality of first partial vias, each first partial via having a side wall, wherein the side wall of each first partial via among the plurality of first partial vias, and/or a metal contact layer arranged on said side wall, forms at least part of a first bottom contact of the electronic package and forms at least part of a mounting surface of the electronic package.

The method may further comprise arranging the metal contact layer on the side wall of at least one first partial via among the plurality of first partial vias after performing the separating action, preferably through an electro-less plating process.

The first substrate and the second substrate may extend in a direction perpendicular to the side wall of each of the plurality of first partial vias.

The separating action may comprise at least one action out of the group consisting of sawing, punching, cutting, splicing and laser cutting.

The electronic package may further comprise a plurality of first outer contacts arranged on an opposing surface of the first dielectric layer and/or the second dielectric layer with respect to the plurality of first inner contacts. Each first outer contact among the plurality of first outer contacts may be electrically connected to at least one first partial via among the plurality of first partial vias, and each first outer contact among the plurality of first outer contacts may form a first side contact of the electronic package. The first substrate and the second substrate may extend parallel to each other.

An outer surface of the first substrate and an outer surface of the second substrate may each form at least part of a side surface of the electronic package. In some embodiments, the outer surface of the first substrate and the outer surface of the second substrate may each extend in a direction perpendicular to the mounting surface.

The electronic package may further comprise a plurality of second inner contacts, each second inner contact being arranged on the first dielectric layer or the second dielectric layer, and a plurality of second vias, each second via being arranged in the first dielectric layer or the second dielectric layer, wherein each second inner contact among the plurality of second inner contacts is electrically connected to at least one second via among the plurality of second vias. The method may further comprise arranging one or more second electronic components in between the first and second substrate, each of the one or more second electronic components having a plurality of second terminals, each second terminal being electrically connected to at least one second inner contact among the plurality of second inner contacts, and each second inner contact among the plurality of second inner contacts being electrically connected to at least one second terminal. Furthermore, the separating surface along which the separating action is performed may additionally extend through the plurality of second vias, the separating action thereby forming a plurality of second partial vias, each second partial via having a side wall, wherein the side wall of each second partial via among the plurality of second partial vias, and/or a metal contact layer arranged on said side wall, forms at least part of a second bottom contact of the electronic package and forms at least part of the mounting surface of the electronic package.

The electronic package may further comprise a plurality of second outer contacts arranged on an opposing surface of the first dielectric layer and/or the second dielectric layer with respect to the plurality of second inner contacts. Each second outer contact among the plurality of second outer contacts may be electrically connected to at least one second partial via among the plurality of second partial vias, and each second outer contact among the plurality of second outer contacts may form a second side contact of the electronic package.

At least one of the plurality of first inner contacts may be electrically connected to at least one of the plurality of second inner contacts. Additionally or alternatively, at least one of the plurality of first outer contacts may be electrically connected to at least one of the plurality of second outer contacts.

At least one of the first electronic component and, if applicable, the one or more second electronic components may comprise a semiconductor die having a circuit integrated thereon. Each circuit may comprise a plurality of circuit terminals, each circuit terminal being electrically connected to a respective terminal of said first or second electronic component.

The method may further comprise arranging an encapsulation material in between the first substrate and the second substrate. The encapsulation material, the first substrate and the second substrate may together encapsulate the first electronic component and/or, if applicable, the one or more second electronic components. In some embodiments, the encapsulation material may comprise a moulding compound or an underfill material having a high capillary action at least during arranging said encapsulation material in between the first substrate and the second substrate.

The first substrate and/or the second substrate may comprise a printed circuit board, 'PCB', preferably one of an organic substrate, a ceramic substrate and a glass substrate.

The package body may comprise a plurality of said package portions for substantially simultaneously manufacturing a corresponding plurality of electronic packages. Furthermore, said separating action along a separating surface may be repeatedly or simultaneously performed for said plurality of said package portions for singulating the plurality of electronic packages.

BRIEF DESCRIPTION OF THE DRAWINGS

Next, the present disclosure will be described in more detail with reference to the appended drawings, wherein.

Hereinafter, reference is made to the appended drawings. It should be noted that identical reference signs may be used to refer to identical or similar components.

DETAILED DESCRIPTION

Figure 1:
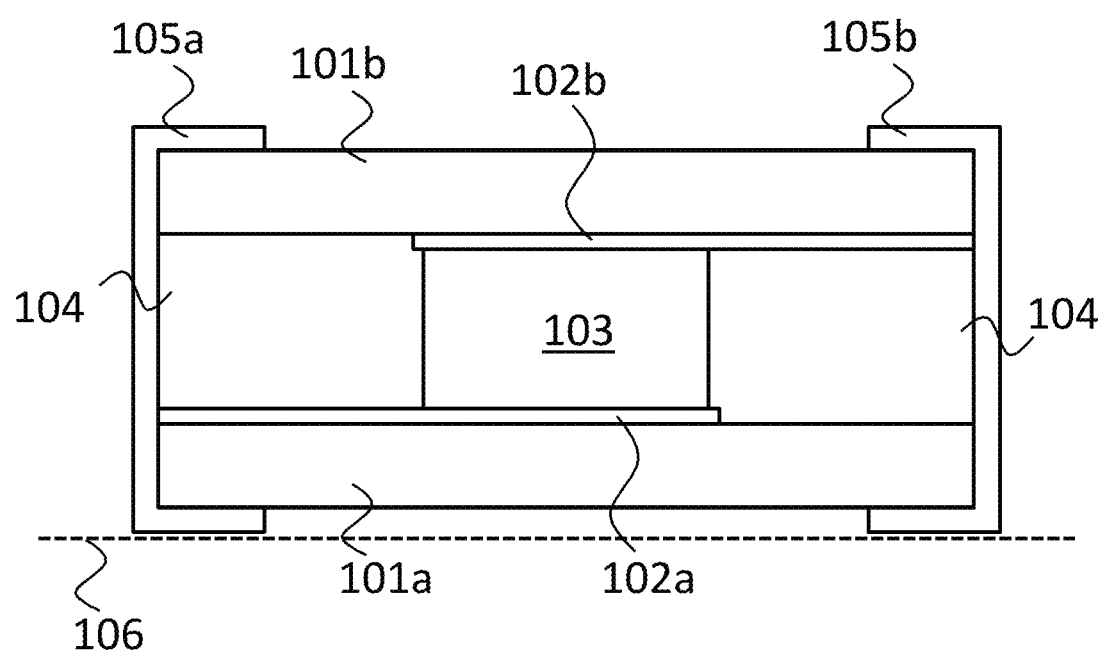
FIG. 1 is a cross-sectional view of an electronic package known in the art.
Figure 2A:
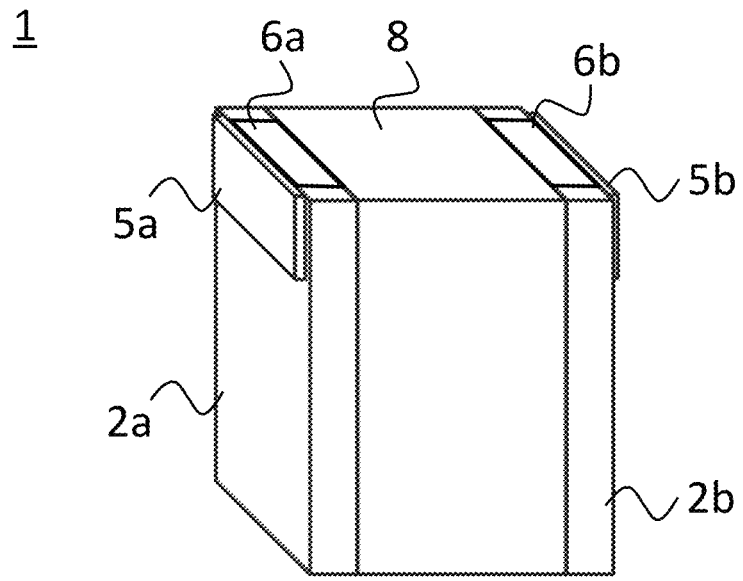
FIG. 2A is a perspective view of an electronic package according to an embodiment of the present disclosure.
Figure 2B:
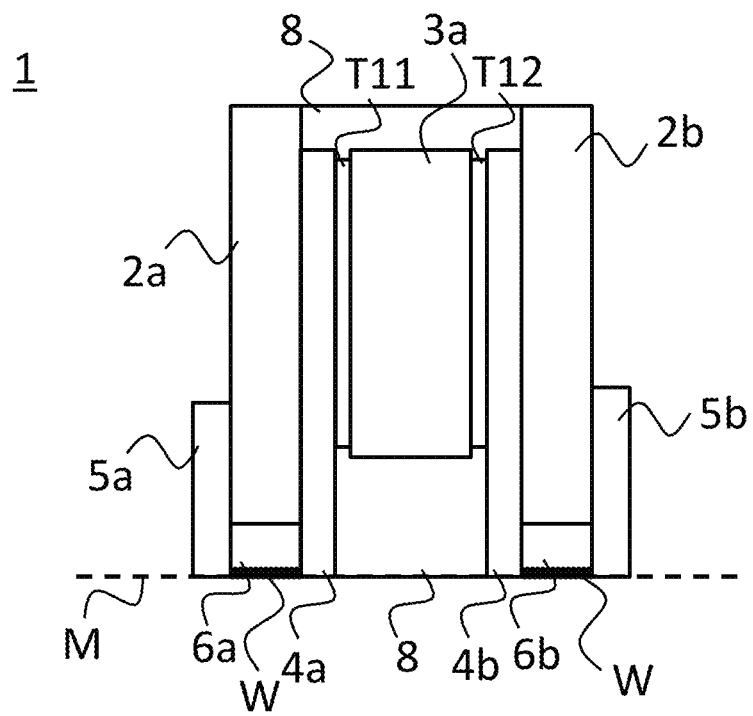
FIG. 2B is a cross-sectional view of the electronic package shown in FIG. 2A.

In FIG. 2A, an electronic package 1 according to an embodiment of the present disclosure is shown. In FIG. 2B, a cross-sectional view of electronic package 1 of FIG. 2A is shown.

Electronic package 1 comprises a first substrate comprising a first dielectric layer 2a, and a second substrate comprising a second dielectric layer 2b. One or both of the first substrate and the second substrate comprise, for example, a PCB or a glass substrate.

Electronic package 1 further comprises a first electronic component 3a arranged in between said first dielectric layer 2a and second dielectric layer 2b. For example, first electronic component 3a comprises a semiconductor die having a circuit integrated on, the circuit comprising a plurality of circuit terminals. In that case, the circuit terminals of the circuit integrated on the semiconductor die may be connected to contacts formed by first terminals T11, T12. Such contacts may be conventionally formed using a metal layer stack arranged on top of the semiconductor die, as will be appreciated by a person skilled in the art. Nevertheless, the present disclosure similarly applies to other types of electronic components having first terminals T11, T12.

In particular, in the embodiment shown in FIGS. 2A and 2B, first electronic component 3a is a two-terminal device, the two first terminals T11, T12 being arranged on opposing surfaces of first electronic component 3a. However, the present disclosure is not limited thereto, and first electronic component 3a may generally comprise two or more first terminals, which need not be arranged at a same side of first electronic component 3a.

As shown in FIG. 2B, first dielectric layer 2a has arranged thereon a first inner contact 4a that is electrically connected to first terminal T11 of first electronic component 3a. Similarly, second dielectric layer 2b has arranged thereon a first inner contact 4b that is electrically connected to first terminal T12 of first electronic component.

A side wall of a first partial via 6a, which previously formed part of a first via extending through first dielectric layer 2a prior to forming electronic package 1, may be exposed at a mounting surface M of electronic package 1 and may form at least part of a first bottom contact thereof. However, in some embodiments, the side wall of first partial via 6a partially or fully covered by a metal contact layer W, and the metal contact layer forms, additionally or alternatively, at least part of the first bottom contact. Such a metal contact layer may for example improve the solderability of electronic package 1 during mounting. Similarly, another first partial via 6b that formed part of a via extending through second dielectric layer 2b prior to forming electronic package 1 is provided, a side wall of which (or a metal contact layer arranged thereon) is exposed at mounting surface M of electronic package 1 and forms another first bottom contact thereof. In this embodiment, first partial via 6a is electrically connected to first inner contact 4a, and first partial via 6b is electrically connected to first inner contact 4b.

The mounting surface M of electronic package 1 is herein defined as a surface by which electronic package 1 can be mounted. For example, electronic package 1 may be mounted on a PCB, wherein the first bottom contacts of electronic package 1 enable external access to first terminals T11, T12 of first electronic component 3a.

Here, it is noted that various other configurations alternative to the above are envisaged by the present disclosure. For example, electronic package 1 may comprise a plurality of first partial vias 6a electrically connected to first inner contact 4a, or may comprise a plurality of first inner contacts 4a electrically connected to a first partial via 6a, or a combination thereof. Similarly, electronic package 1 may comprise a plurality of first partial vias 6b electrically connected to first inner contact 4b, or may comprise a plurality of first inner contacts 4b electrically connected to a first partial via 6b, or a combination thereof.

First electronic component 3a is encapsulated in an encapsulation material 8, such as a moulding compound or the like. Encapsulation material 8, together with the first and second substrate, protect first electronic component 3a from external damages, such as due to mechanical stress or light exposure.

Electronic package 1 optionally further comprises a first outer contact 5a arranged on first dielectric layer 2a and a first outer contact 5b arranged on second dielectric layer 2b. First outer contact 5a is electrically connected to first partial via 6a, and first outer contact 5b is electrically connected to first partial via 6b. First outer contacts 5a, 5b form side contacts of electronic package 1 and may be particularly useful in determining solder joint reliability in automated optical inspections of electronic package after mounting said electronic package 1.

Various configurations different from the embodiment shown in FIGS. 2A and 2B are also envisaged. For example, first partial vias 6a, 6b need not be directly connected to first inner contacts 4a, 4b, but may instead be electrically connected thereto through first outer contacts 5a, 5b and respective one or more vias (not shown) extending through first and second dielectric layer 2a, 2b. Similarly, first partial vias 6a, 6b need not be directly connected to first outer contacts 5a, 5b, but may instead be electrically connected thereto through first inner contacts 4a, 4b and respective one or more vias (not shown) extending through first and second dielectric layer 2a, 2b.

An exemplary method for manufacturing electronic package 1 is described below with reference to the cross-sectional views of FIGS. 3A-3E.

Figure 3A:
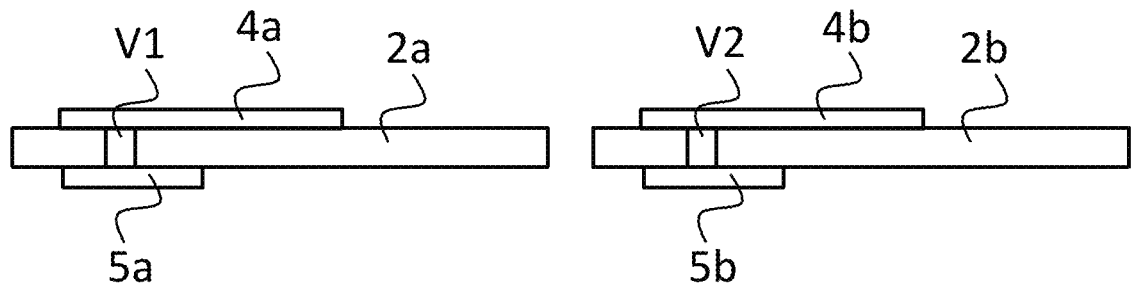
FIGS. 3A, 3B, 3C, 3D and 3E illustrate a method of manufacturing an electronic package according to an embodiment of the present disclosure.

First, in FIG. 3A, a first substrate comprising first dielectric layer 2a and a second substrate comprising second dielectric layer 2b are provided. Depending on the terminal arrangement of first electronic component 3a, first inner contacts 4a, 4b may be arranged on either or both of first and second dielectric layer 2a, 2b. Similarly, first vias V1, V2, may be arranged in either or both of first and second dielectric layer 2a, 2b. Optionally, one or both of the first and second substrate comprise first outer contacts 5a, 5b, respectively, that are electrically connected to said first vias. In the example of FIG. 3A, when first electronic component 1 comprises first terminals T11, T12 arranged on opposing sides thereof, each of first and second dielectric layer 2a, 2b may have a respective first inner contact, first via, and first outer contact.

Figure 3B:
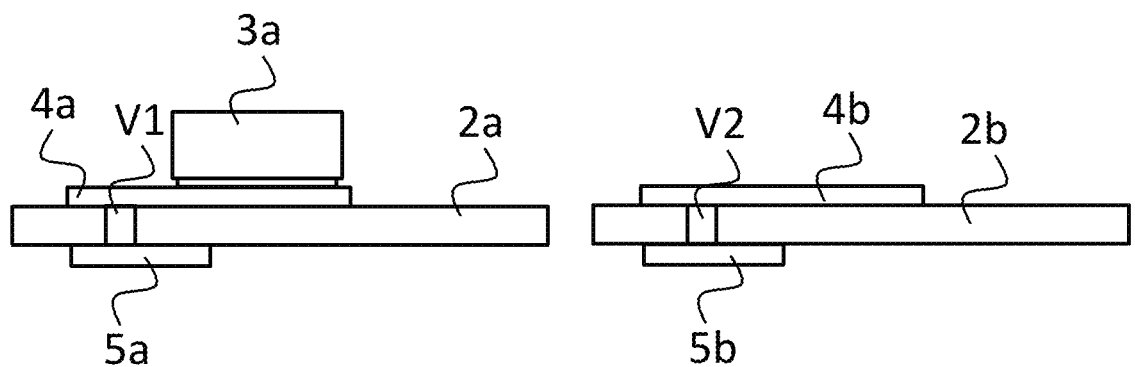

Next, referring to FIG. 3B, first electronic component 3a is arranged on first inner contact 4a of the first substrate. For example, first electronic component 3a is attached to first inner contact 4a through a metal layer, such as a solder material, or copper, aluminum or silver, such that first terminal T11 is electrically connected to first inner contact 4a.

Figure 3C:
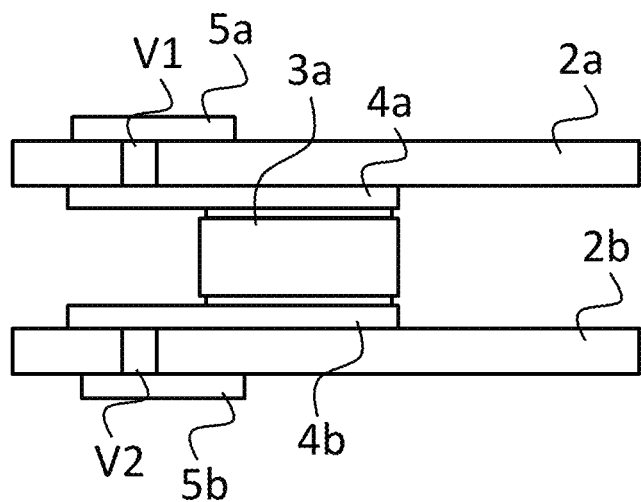

As shown in FIG. 3C, the first and second substrate are arranged to face each other, and first electronic component 3a is arranged in between the first and second substrate. More particularly, first terminal T12 of first electronic component 3a is attached and electrically connected to first inner contact 4b. Said electrical connection to first inner contact 4b may similarly be formed through a metal layer.

Figure 3D:
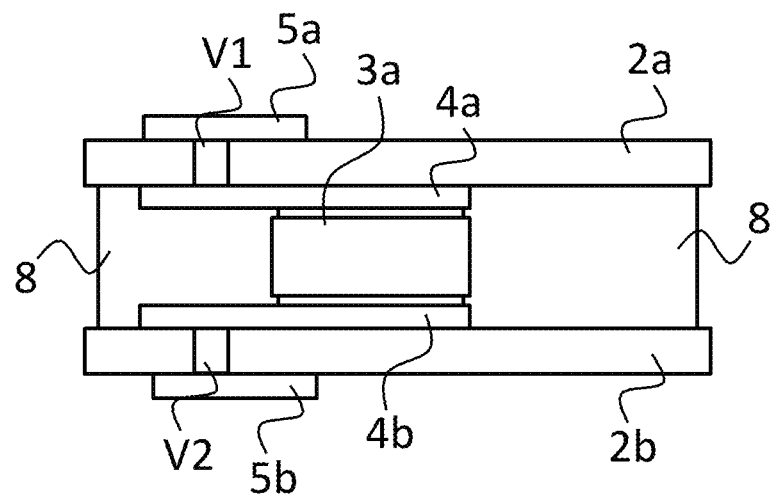

Next, in FIG. 3D, the first and second substrates are mutually fixated, thereby defining a package body comprising a package portion in which first inner contact 4a, first inner contact 4b, and first electronic component 3a are arranged. For example, the mutually fixating comprises arranging an encapsulation material 8 in between the first and second substrate, wherein encapsulation material 8 together with the first and second substrate encapsulate first electronic component 3a. Encapsulation material 8 may comprise a material that has a high capillary action, at least during arranging said encapsulating material 8 in between the first and second substrate, such that the space between the first and second substrate and surrounding first electronic component 3a is sufficiently filled with said material. As an example only, encapsulation material 8 may be a moulding compound that is applied in between the first and second substrate. By allowing the moulding compound to solidify, a body of solidified moulding compound is formed that, together with the first and second substrate, encapsulates first electronic component 1. The forming of the body of solidified moulding compound may further comprise a curing step.

Figure 3E:
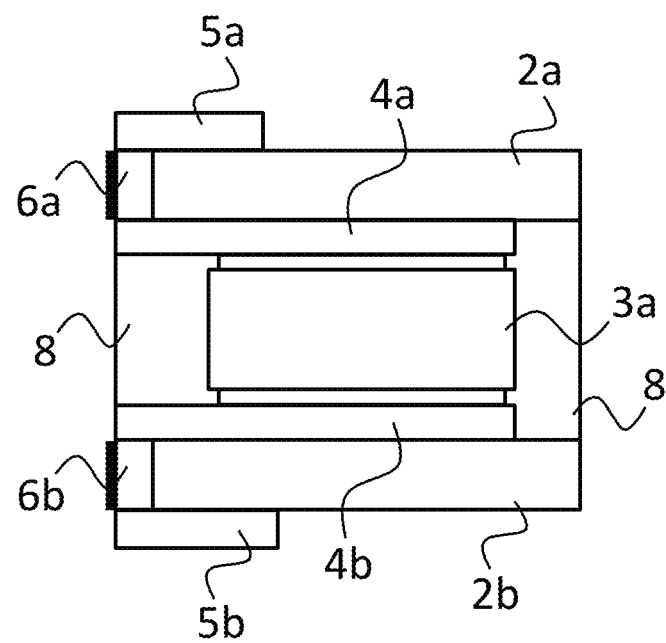

Finally, in FIG. 3E, a separating action is performed along a separating surface extending through the plurality of first vias, thereby separating the package portion from a remainder of the package body and forming first partial vias 6a, 6b, an exposed side wall of which then form first bottom contacts of electronic package 1. The separating surface defines mounting surface M of electronic package 1 at which the first bottom contacts are exposed. For example, the package portion is separated from a remainder of the package body through an action of sawing, cutting (e.g., laser cutting), punching or splicing.

In some embodiments, after the separating action is performed, a metal contact layer W is optionally arranged on the side wall of one or more first partial vias 6a, 6b. Metal contact layer W may for example be arranged or formed through a process of electro-less plating, and may at least partially cover the side wall. As such, the first bottom contact(s) may then be formed by one or both of the side wall and metal contact layer W arranged on said side wall.

Further separating actions may be performed to remove further portions of the package body that need not be present in electronic package 1. Simultaneously or additionally, the separating action and/or the further separating actions may at least result in partially singulating electronic package 1 from other identical or similar electronic packages manufactured substantially simultaneously with the same first and second substrate, as will be further described below with reference to FIG. 4.

Figure 4:
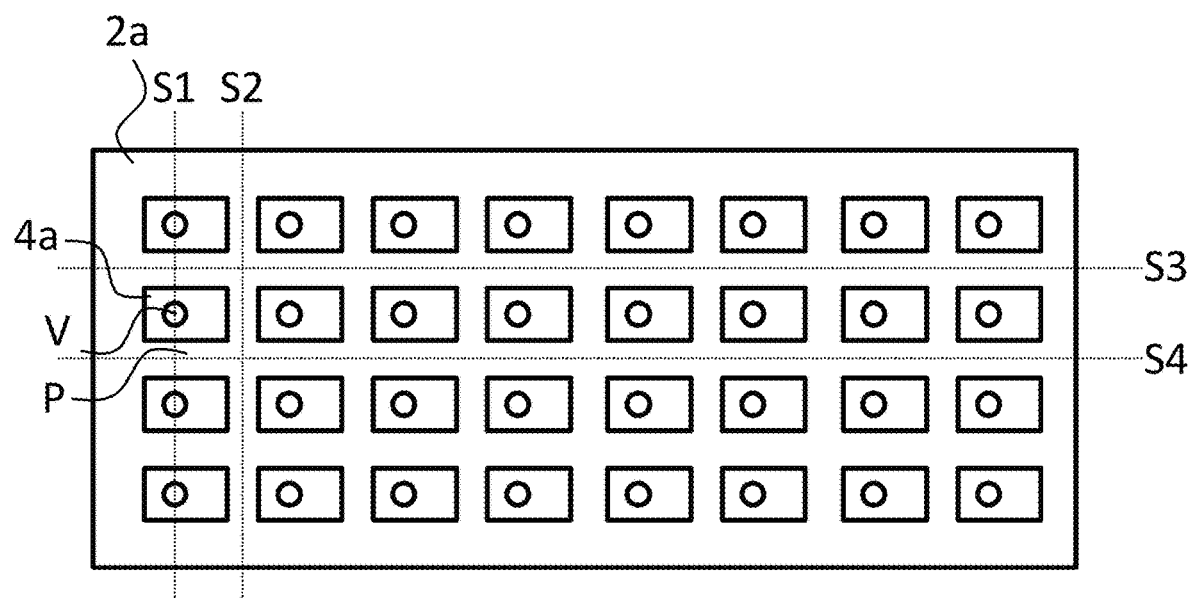
FIG. 4 is a top view of a substrate according to an embodiment of the present disclosure.

FIG. 4 shows a bottom view of the first substrate, or a portion thereof. The first substrate comprises first dielectric layer 2a on which a plurality of first inner contacts 4a are arranged. Furthermore, a plurality of first vias V extend through first dielectric layer 2a and are electrically connected to the plurality of first inner contacts 4a. Although not shown in FIG. 4, in some embodiments, some or all of first inner contacts 4a may have more than one corresponding first via V electrically connected thereto, and vice versa. One or more first outer contacts (not shown) may be arranged on an opposing side of first dielectric layer 2a. In particular, the first inner contacts 4a and corresponding first vias V are arranged in an A×B array, wherein A and B are both equal to or greater than one.

Here, it is noted that the second substrate may be similar or substantially identical to the first substrate. For example, the second substrate similarly comprises a dielectric layer having a plurality of first contacts arranged thereon and having a plurality of first vias extending through said dielectric layer. In some embodiments, first inner contacts 4a of the first substrate may have a same dimension as the first inner contacts of the second substrate. A detailed description thereof is omitted.

Each first inner contact 4a and first via V may correspond to and form part of a particular package portion P upon subjecting the first substrate to the method for manufacturing one or more electronic packages 1 in accordance with FIGS. 3A-3E. For example, each package portion P may comprise one or more first inner contacts 4a and corresponding one or more first vias V. As indicated with dashed lines in FIG. 4, a part of the separating action is performed along a separating surface 51 extending through first via V of package portion P, thereby separating package portion P from a remainder of the package body formed in part by a remainder of the first substrate. In addition, a portion of first vias V outside the package portion is removed through said separating action, thereby forming a plurality of first partial vias forming first bottom contacts of the electronic package.

The separating action along separating surface 51 may at least partially singulate package portion P from the remainder of the package body, which package body may comprise one or more additional package portions. Additionally, further separating actions may be performed along separating surfaces S2, S3, S4 to fully singulate package portion P from the remainder of the package body. The separating action and the further separating action(s) can be repeatedly or simultaneously performed for said plurality of said package portions P for singulating the plurality of electronic packages 1 from one another.

It is noted that, although the vias are shown as having a circular cross-sectional shape, the present disclosure is not limited to this particular shape of via. For example, the via could alternatively have an elliptical shape, a polygonal shape (e.g., triangular or rectangular), or the like. In addition, the via need not have an identical cross-sectional shape at each cross-section parallel to the surface of first dielectric layer 2a. For example, the cross-sectional area and/or shape at a top surface of first dielectric layer 2a may differ from the cross-sectional area and/or shape at a bottom surface of first dielectric layer 2a and/or in between the top surface and the bottom surface. Furthermore, first inner contacts 4a, first vias V and first outer contacts (not shown) may have different shapes and/or dimensions within a same package portion and/or between multiple package portions.

Figure 5:
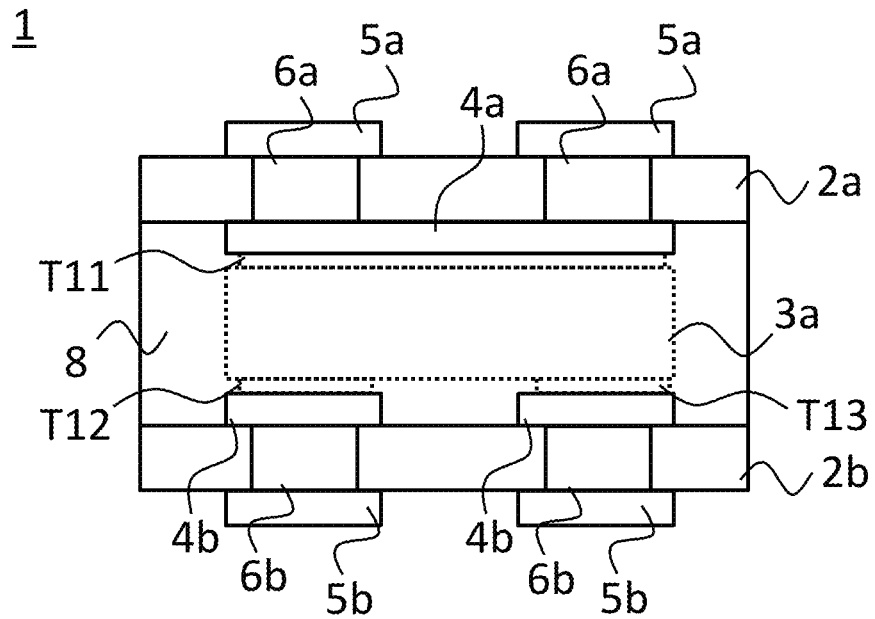
FIGS. 5, 6, 7 and 8 are cross-sectional views of electronic packages according to various embodiments of the present disclosure.

In FIG. 5, a cross-sectional view of electronic package 1 according to another embodiment of the present disclosure is shown. This embodiment differs from that of FIG. 2B in that first electronic component 3a is a three-terminal device.

First terminal T11 is electrically connected to first inner contact 4a, which in turn is electrically connected to first partial vias 6a and first outer contacts 5a. In this embodiment, first inner contact 4a is shown to be electrically connected to two first partial vias 6a and corresponding two first outer contacts 5a, though the present disclosure may similarly apply to any number of first inner contacts 4a, first outer contacts 5a and first partial vias 6a electrically connected to first terminal T11. First terminals T12, T13, which are arranged on an opposing surface of first electronic component 3a with respect to first terminal T11, are electrically connected to respective first inner contacts 4b, which in turn are electrically connected to respective first partial vias 6b and first outer contacts 5b.

In this embodiment, a mounting surface of electronic package 1 is perpendicular to the viewing direction of the cross-sectional view of FIG. 5. Furthermore, first electronic component 3a is shown with a dotted outline to indicate its position within encapsulating material 8 of electronic package 1 in the cross-sectional view.

Figure 6:
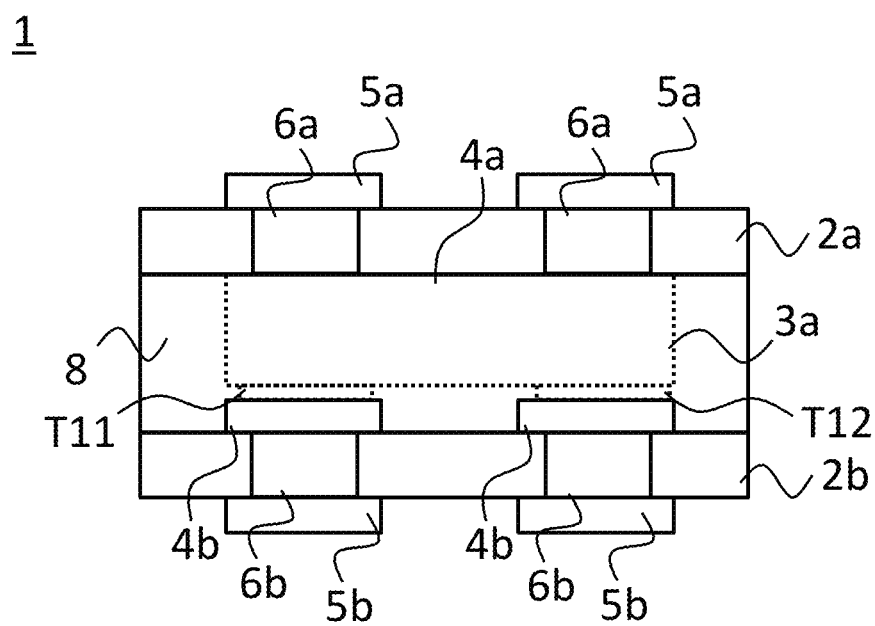

FIG. 6 shows an alternative embodiment of electronic package 1 according to the present disclosure. In this embodiment, both terminals T11, T12 of first electronic component 3a are arranged at a same side thereof. As such, only first inner contacts 4b need to be provided, and side walls of first partial vias 6b, and/or a metal contact layer arranged thereon, form the first bottom contacts that enable external access to said first terminals T11, T12.

Since there are no terminals of first electronic component 1 at a side of the first substrate, there need not be any first inner contacts, first outer contacts and first partial vias at first dielectric layer 2a. However, in some further embodiments, such as the one shown in FIG. 6, one or more of said first inner contacts 4a, first outer contacts 5a and first partial vias 6a may nevertheless be arranged or provided at first dielectric substrate 2a, for example to ensure that a footprint of electronic package 1 is symmetrical and/or to improve mountability of electronic package 1.

Figure 7:
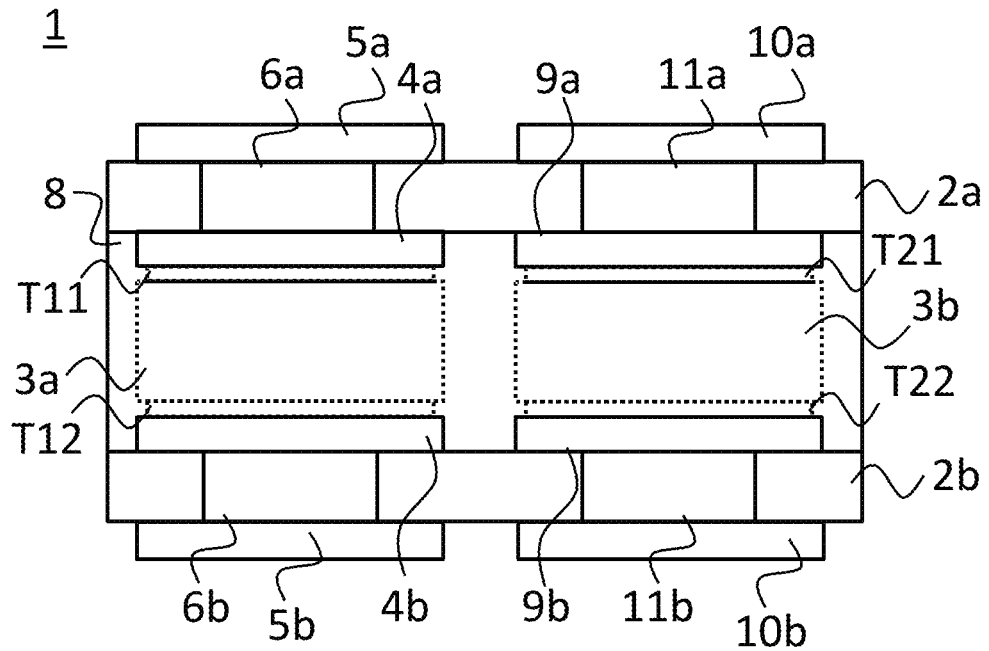

FIG. 7 shows another embodiment of electronic package 1 according to the present disclosure. Electronic package 1 in this embodiment further comprises a second electronic component 3b (e.g., a semiconductor die) arranged in between the first and second substrate. Second electronic component comprises a plurality of second terminals T21, T22.

In addition, the first and second substrate further comprise second inner contacts 9a, 9b arranged on an inner surface of first and second dielectric layers 2a, 2b, second outer contacts 10a, 10b arranged on an outer surface of first and second dielectric layers 2a, 2b, and second partial vias 11a, 11b. Second terminals T21, T22 of second electronic component 3b are electrically connected to respective second inner contacts 9a, 9b.

A side wall of second partial vias 11a, 11b, and/or a metal contact layer arranged thereon, are exposed at the mounting surface of electronic package 1 and form second bottom contacts of electronic package 1 for enabling external access to corresponding second terminals T21, T22 of second electronic component 3b.

Second electronic component 3b is shown in FIG. 6 as being spaced apart from first electronic component 3a without electrical connections. As a result, electronic package 1 comprises two separate electronic components, each with separate However, in some embodiments, one or more of first inner contacts 4a, 4b may be electrically connected to one or more of second inner contacts 9a, 9b. For example, first inner contact 4a and second inner contact 9a may be electrically connected through a metal interconnect (not shown), or may be integrally formed therewith to form a single inner contact electrically connected to at least one terminal of each of first and second electronic component 3a, 3b. Similarly, one or more of first outer contacts 5a, 5b may be electrically connected to one or more of second outer contacts 10a, 10b. In doing so, one or more terminals of first electronic component 3a can be electrically connected to one or more terminals of second electronic component 3b internally to electronic package 1. In particular, said first and second electronic component 3a, 3b could be arranged in series in parallel, or in other configurations.

Figure 8:
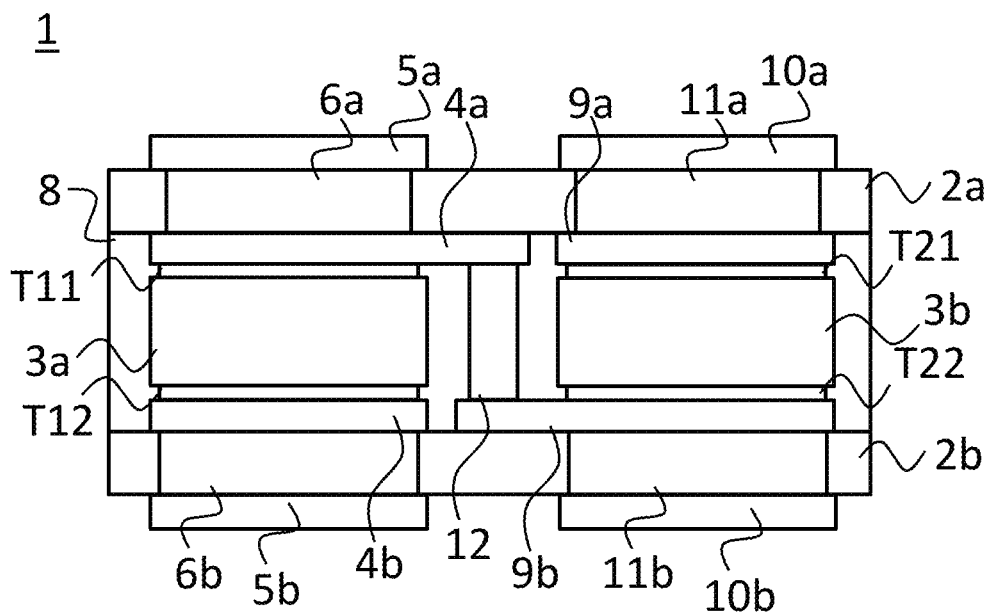

FIG. 8 illustrates another embodiment of electronic package 1, in which an electrical connection 12 is formed between first inner contact 4a and second inner contact 9b. Electrical connection 12 for example comprises a metal post or pillar, such as copper, extending from first inner contact 4a to second inner contact 9b. Other configurations of interconnecting various inner contacts and/or outer contacts of electronic package 1 are also envisaged.

Although first and second electronic component 3a, 3b are shown as being two-terminal devices in FIGS. 6 and 7, the present disclosure is not limited thereto. First electronic component 3a and second electronic component 3b may have any number of terminals. Furthermore, first and second electronic component 3a, 3b may be substantially identical, though they need not be so. For example, one or both of first and second electronic component 3a, 3b may comprise a semiconductor die having a circuit integrated thereon, the circuit comprising a plurality of first terminals and second terminals, respectively. As an example only, the first and second electronic component 3a, 3b may be one of a diode-type device or a transistor-type device, or a circuit comprising the same.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. An electronic package comprising:
   a first substrate comprising a first dielectric layer;
   a second substrate comprising a second dielectric layer, the second substrate being mutually fixated relative to the first substrate;
   a first electronic component arranged in between the first and second substrates, the first electronic component having a plurality of first terminals; and
   a plurality of first inner contacts, each first inner contact being arranged on the first dielectric layer or the second dielectric layer;
   wherein each first terminal among the plurality of first terminals is electrically connected to at least one first inner contact among the plurality of first inner contacts, and wherein each first inner contact among the plurality of first inner contacts is electrically connected to at least one first terminal among the plurality of first terminals;
   wherein the electronic package further comprises a plurality of first partial vias, each first partial via having a side wall and being arranged in the first or second dielectric layer, wherein each first inner contact among the plurality of first inner contacts is electrically connected to at least one first partial via among the plurality of first partial vias, wherein the side wall of each first partial via among the plurality of first partial vias, and/or a metal contact layer arranged on the side wall, forms at least part of a first bottom contact of the electronic package and forms at least part of a mounting surface of the electronic package.

2. The electronic package according to claim 1, wherein the first substrate and the second substrate extend in a direction perpendicular to the side wall of each of the plurality of first partial vias.

3. The electronic package according to claim 1, further comprising a plurality of first outer contacts arranged on an opposing surface of the first dielectric layer and/or the second dielectric layer with respect to the plurality of first inner contacts;
   wherein each first outer contact among the plurality of first outer contacts is electrically connected to at least one first partial via among the plurality of first partial vias, and wherein each first outer contact among the plurality of first outer contacts forms a first side contact of the electronic package.

4. The electronic package according to claim 1, wherein the first substrate and the second substrate extend parallel to each other; and/or
   wherein the first substrate has an outer surface, and the second substrate has an outer surface that each form at least part of a side surface of the electronic package, and wherein the outer surface of the first substrate and the outer surface of the second substrate each extend in a direction perpendicular to the mounting surface.

5. The electronic package according to claim 1, further comprising:
   one or more second electronic components arranged in between the first and second substrates, each of the one or more second electronic components having a plurality of second terminals;
   a plurality of second inner contacts, each second inner contact being arranged on the first dielectric layer or the second dielectric layer;
   a plurality of second partial vias, each second partial via having a side wall and being arranged in the first or second dielectric layer, wherein each second inner contact among the plurality of second inner contacts is electrically connected to at least one second partial via among the plurality of second partial vias, wherein the side wall of each second partial via among the plurality of second partial vias, and/or a metal contact layer arranged on the side wall, forms at least part of a second bottom contact of the electronic package and forms at least part of the mounting surface of the electronic package;

wherein each second terminal is electrically connected to at least one second inner contact among the one or more second inner contacts, and wherein each second inner contact among the plurality of second inner contacts is electrically connected to at least one second terminal;

wherein the electronic package further comprises a plurality of second outer contacts arranged on an opposing surface of the first dielectric layer and/or the second dielectric layer with respect to the plurality of second inner contacts, wherein each second outer contact among the plurality of second outer contacts is electrically connected to at least one second partial via among the plurality of second partial vias, and wherein each second outer contact among the plurality of second outer contacts forms a second side contact of the electronic package.

6. The electronic package according to claim 2, further comprising a plurality of first outer contacts arranged on an opposing surface of the first dielectric layer and/or the second dielectric layer with respect to the plurality of first inner contacts;

wherein each first outer contact among the plurality of first outer contacts is electrically connected to at least one first partial via among the plurality of first partial vias, and wherein each first outer contact among the plurality of first outer contacts forms a first side contact of the electronic package.

7. The electronic package according to claim 5, wherein at least one of the plurality of first inner contacts is electrically connected to at least one of the plurality of second inner contacts; and/or wherein at least one of the plurality of first outer contacts is electrically connected to at least one of the plurality of second outer contacts.

8. The electronic package according to claim 5, wherein at least one of the first electronic component and the one or more second electronic components comprises a semiconductor die having a circuit integrated thereon;

wherein each circuit comprises a plurality of circuit terminals, each circuit terminal being electrically connected to a respective terminal of the first or second electronic component; and/or wherein the electronic package further comprises an encapsulation material arranged in between the first substrate and the second substrate, wherein the encapsulation material, the first substrate and the second substrate together encapsulate the first electronic component and/or, the one or more second electronic components, and wherein the encapsulation material comprises a molding compound or an underfill material having high capillary action at least during arranging the encapsulation material in between the first substrate and the second substrate; and/or wherein the first substrate and/or the second substrate comprises a printed circuit board, 'PCB', and wherein the PCB is selected from the group consisting of: an organic substrate, a ceramic substrate, and a glass substrate.

9. A method for manufacturing an electronic package, the method comprising the steps of:

providing a first substrate comprising a first dielectric layer and a second substrate comprising a second dielectric layer, wherein each of a plurality of first inner contacts is arranged on the first dielectric layer or the second dielectric layer, wherein each of a plurality of first vias is arranged in the first dielectric layer or the second dielectric layer, and wherein each first inner contact among the plurality of first inner contacts is electrically connected to at least one first via among the plurality of first vias;

arranging a first electronic component in between the first and second substrates, the first electronic component comprising a plurality of first terminals, each first terminal among the plurality of first terminals being electrically connected to at least one first inner contact among the plurality of first inner contacts, and each first inner contact among the plurality of first inner contacts being electrically connected to at least one first terminal among the plurality of first terminals;

mutually fixating the first and second substrates, thereby defining a package body comprising a package portion in which the plurality of first inner contacts and the first electronic component are arranged;

performing a separating action along a separating surface extending through the plurality of first vias, thereby:

separating the package portion from a remainder of the package body;

forming a plurality of first partial vias, each first partial via having a side wall, and wherein the side wall of each first partial via among the plurality of first partial vias, and/or a metal contact layer arranged on the side wall, forms at least part of a first bottom contact of the electronic package and forms at least part of a mounting surface of the electronic package.

10. The method according to claim 9, further comprising arranging the metal contact layer on the side wall of at least one first partial via among the plurality of first partial vias after performing the separating action, using an electro-less plating process; and/or wherein the first substrate and the second substrate extend in a direction perpendicular to the side wall of each of the plurality of first partial vias; and/or wherein the separating action comprises at least one action out of the group consisting of sawing, punching, cutting, splicing, and laser cutting.

11. The method according to claim 9, wherein the electronic package further comprises a plurality of first outer contacts arranged on an opposing surface of the first dielectric layer and/or the second dielectric layer with respect to the plurality of first inner contacts;

wherein each first outer contact among the plurality of first outer contacts is electrically connected to at least one first partial via among the plurality of first partial vias, and wherein each first outer contact among the plurality of first outer contacts forms a first side contact of the electronic package.

12. The method according to claim 9, wherein the first substrate and the second substrate extend parallel to each other; and/or wherein the first substrate has an outer surface, and the second substrate has an outer surface that each form at least part of a side surface of the electronic package, and wherein the outer surface of the first substrate and the outer surface of the second substrate each extend in a direction perpendicular to the mounting surface.

13. The method according to claim 9, further comprising a plurality of second inner contacts, each second inner contact being arranged on the first dielectric layer or the second dielectric layer, and a plurality of second vias, each second via being arranged in the first dielectric layer or the second dielectric layer, wherein each second inner contact among the plurality of second inner contacts is electrically connected to at least one second via among the plurality of second vias;

wherein the method further comprises arranging one or more second electronic components in between the first and second substrates, each of the one or more second electronic components having a plurality of second terminals, each second terminal being electrically connected to at least one second inner contact among the plurality of second inner contacts, and each second inner contact among the plurality of second inner contacts being electrically connected to at least one second terminal; and wherein the separating surface along which the separating action is performed additionally extends through the plurality of second vias, the separating action thereby forming a plurality of second partial vias, each second partial via having a side wall, and wherein the side wall of each second partial via among the plurality of second partial vias, and/or a metal contact layer arranged on the side wall, forms at least part of a second bottom contact of the electronic package and forms at least part of the mounting surface of the electronic package.

14. The method according to claim 9, wherein the package body comprises a plurality of package portions for substantially simultaneously manufacturing a corresponding plurality of electronic packages;
   wherein the separating action along a separating surface is repeatedly or simultaneously performed for the plurality of the package portions for singulating the plurality of electronic packages.

15. The method according to claim 10, wherein the electronic package further comprising a plurality of first outer contacts arranged on an opposing surface of the first dielectric layer and/or the second dielectric layer with respect to the plurality of first inner contacts;
   wherein each first outer contact among the plurality of first outer contacts is electrically connected to at least one first partial via among the plurality of first partial vias, and wherein each first outer contact among the plurality of first outer contacts forms a first side contact of the electronic package.

16. The method according to claim 13, the electronic package further comprising a plurality of second outer contacts arranged on an opposing surface of the first dielectric layer and/or the second dielectric layer with respect to the plurality of second inner contacts, wherein each second outer contact among the plurality of second outer contacts is electrically connected to at least one second partial via among the plurality of second partial vias;
   wherein each second outer contact among the plurality of second outer contacts forms a second side contact of the electronic package;
   wherein at least one of the plurality of first outer contacts is electrically connected to at least one of the plurality of second outer contacts; and/or
   wherein at least one of the plurality of first inner contacts is electrically connected to at least one of the plurality of second inner contacts.

17. The electronic package according to claim 13, wherein at least one of the first electronic component and the one or more second electronic components comprises a semiconductor die having a circuit integrated thereon, and wherein each circuit comprises a plurality of circuit terminals, each circuit terminal being electrically connected to a respective terminal of the first or second electronic component; and/or
   wherein the mutually fixing the first and second substrates comprises arranging an encapsulation material in between the first substrate and the second substrate, wherein the encapsulation material, the first substrate and the second substrate together encapsulate the first electronic component and/or, if applicable, the one or more second electronic components, and wherein the encapsulation material comprises a molding compound or an underfill material having high capillary action at least during arranging the encapsulation material in between the first substrate and the second substrate; and/or
   wherein the first substrate and/or the second substrate comprises a printed circuit board, 'PCB', and wherein the PCB is selected from the group consisting of: organic substrate, a ceramic substrate, and a glass substrate.

18. The method according to claim 17, wherein the package body comprises a plurality of the package portions for substantially simultaneously manufacturing a corresponding plurality of electronic packages; and
   wherein the separating action along a separating surface is repeatedly or simultaneously performed for the plurality of the package portions for singulating the plurality of electronic packages.

* * * * *